(12) United States Patent
Yamanaka (10) Patent No.: US 10,751,747 B2
(45) Date of Patent: Aug. 25, 2020

(54) APPLICATION MECHANISM, APPLICATION APPARATUS, METHOD FOR MANUFACTURING OBJECT TO WHICH APPLICATION MATERIAL IS APPLIED, AND METHOD FOR MANUFACTURING SUBSTRATE (71) Applicant: NTN CORPORATION, Osaka-shi, Osaka (JP)

(72) Inventor: Akihiro Yamanaka, Iwata (JP)

(73) Assignee: NTN CORPORATION, Osaka (JP)

( * ) Notice: Subject to any disclaimer, the term of this patent is extended or adjusted under 35 U.S.C. 154(b) by 0 days.

(21) Appl. No.: 16/072,874

(22) PCT Filed: Jan. 13, 2017

(86) PCT No.: PCT/JP2017/001040
§ 371 (c)(1),
(2) Date: Jul. 25, 2018

(87) PCT Pub. No.: WO2017/130741
PCT Pub. Date: Aug. 3, 2017

(65) Prior Publication Data
US 2019/0060948 A1    Feb. 28, 2019

(30) Foreign Application Priority Data

Jan. 27, 2016  (JP) .................. 2016-013003

(51) Int. Cl.
B05C 1/02     (2006.01)
B05C 5/02     (2006.01)
(Continued)

(52) U.S. Cl.
CPC .............. B05C 5/0212 (2013.01); B05C 1/02 (2013.01); B05C 5/0291 (2013.01); B05C 11/11 (2013.01);
(Continued)

(58) Field of Classification Search
CPC .. B05D 1/26; B05D 1/28; B05D 11/11; B05C 5/02; B05C 5/0212; B05C 5/0291; H01L 21/6715
(Continued)

(56) References Cited

U.S. PATENT DOCUMENTS

2003/0089795 A1* 5/2003 Kikuchi .................... B05C 5/02
                                                           239/118
2003/0155380 A1* 8/2003 Kim ...................... B05O 5/0212
                                                           222/394
(Continued)

FOREIGN PATENT DOCUMENTS

CN     1589976 A     3/2005
CN     1991505 A     7/2007
(Continued)

OTHER PUBLICATIONS

Search Report issued in corresponding International Patent Application No. PCT/JP2017/001040, dated Mar. 7, 2017.
(Continued)

Primary Examiner — Brian K Talbot
(74) Attorney, Agent, or Firm — McDermott Will & Emery LLP (57) ABSTRACT An application material container has a fixed portion and a container portion. The fixed portion is configured to be fixable to a fixing member included in an application mechanism. The container portion is provided with, in upper and lower portions thereof, a hole and a hole through which an application needle passes. A side surface of the container portion has a first flange. A lower surface of the first flange is in contact with an upper surface of the fixed portion. A gap is provided between a portion lower than the first flange on the side surface of the container portion and a side surface
(Continued)

of the fixed portion. The container portion is horizontally movable within a range of the gap.

7 Claims, 6 Drawing Sheets (51) Int. Cl.
    *B05D 1/28*     (2006.01)
    *B05C 11/11*     (2006.01)
    *H01L 21/67*     (2006.01)
    *H01L 23/00*     (2006.01)

(52) U.S. Cl.
    CPC ............ *B05D 1/28* (2013.01); *H01L 21/6715* (2013.01); *H01L 24/27* (2013.01); *H01L 24/743* (2013.01); *H01L 2224/27318* (2013.01); *H01L 2924/12041* (2013.01); *H01L 2924/1461* (2013.01)

(58) Field of Classification Search
    USPC .......................................................... 118/241
    See application file for complete search history.

(56) References Cited

U.S. PATENT DOCUMENTS

| | | |
|---|---|---|
| 2005/0045653 A1 | 3/2005 | Tanaka et al. |
| 2006/0139406 A1* | 6/2006 | Tsuchiya .................. B05D 1/26 347/54 |
| 2010/0080912 A1* | 4/2010 | Koyama ............... B05C 5/0225 427/256 |
| 2016/0279661 A1* | 9/2016 | Tanaka .................. B05C 5/0225 |
| 2016/0279664 A1* | 9/2016 | Ikushima ................ B05C 5/001 |
| 2018/0252512 A1* | 9/2018 | Ohba .................. G01B 9/02012 |
| 2018/0264506 A1* | 9/2018 | Ikushima ................ B05C 11/10 |

FOREIGN PATENT DOCUMENTS

| | | |
|---|---|---|
| CN | 101047090 A | 10/2007 |
| CN | 1840356 B | 5/2010 |
| CN | 102974496 A | 3/2013 |
| JP | 2006-276188 A | 10/2006 |
| JP | 2006-310266 A | 11/2006 |
| JP | 4802027 B2 | 10/2011 |

OTHER PUBLICATIONS

Taiwanese Office Action issued in Taiwanese Patent Application No. 106102043, dated Apr. 22, 2020, with partial translation.
Chinese Office Action issued in corresponding Chinese Patent Application No. 201780007891.5, dated May 7, 2020, with English translation.

\* cited by examiner

APPLICATION MECHANISM, APPLICATION APPARATUS, METHOD FOR MANUFACTURING OBJECT TO WHICH APPLICATION MATERIAL IS APPLIED, AND METHOD FOR MANUFACTURING SUBSTRATE

CROSS REFERENCE

This application is the U.S. National Phase under 35 U.S.C. § 371 of International Application No. PCT/JP2017/001040 filed on Jan. 13, 2017, which claims the benefit of Japanese Application No. 2016-013003, filed on Jan. 27, 2016, the entire contents of each are hereby incorporated by reference.

TECHNICAL FIELD

The present invention relates to an application mechanism, an application apparatus, a method for manufacturing an object to which an application material is applied, and a method for manufacturing a substrate. Particularly, the present invention relates to an application mechanism, an application apparatus, a method for manufacturing an object to which an application material is applied, and a method for manufacturing a substrate, used to apply a liquid droplet of an adhesive with an application needle in a process of mounting a micro electronic component such as an LED (Light Emitting Diode) or MEMS (Micro Electro Mechanical Systems).

BACKGROUND ART

A process of mounting an LED or MEMS includes a step of finely applying an adhesive for packaging. A dispenser method, an ink-jet method and the like are common methods for fine application. A method using an application needle is also one option because this method is capable of finely applying materials of a wide range of viscosities.

As the method for fine application using the application needle, there is a method using an application mechanism described in Japanese Patent No. 4802027 (PTD 1). This application mechanism aims to correct defects of a fine pattern, and is capable of finely applying materials of a wide range of viscosities. On the other hand, as electronic components have become more and more minute in recent years, use applications requiring a more minute and stable amount of application have been increasing. For example, there is a demand for stable application with the accuracy of approximately several n liters ±1 n liter.

CITATION LIST

Patent Document

PTD 1: Japanese Patent No. 4802027

SUMMARY OF INVENTION

Technical Problem

However, the apparatus described in PTD 1 cannot reliably meet such a demand in some cases.
This is because, in the apparatus described in PTD 1, an application material container is positioned using an application material container upper hole and an application needle axis as guides, and is fixed by a magnet, and thus, the application needle axis may be shifted by a gap between the attachment hole and the application needle axis when the application material container is attached. As a result, an amount of application changes slightly, and thus, the above-described demand can no longer be met, or the above-described demand is not sufficiently met although it is met.

Accordingly, an object of the present invention is to provide an application mechanism, an application apparatus, a method for manufacturing an object to which an application material is applied, and a method for manufacturing a substrate, that can prevent an application needle axis from being shifted with respect to an attachment hole when an application material container is attached.

Solution to Problem

In order to solve the above-described problem, an application mechanism in the present invention includes: an application needle; and an application material container configured to house and hold an application material. The application material container has a fixed portion and a container portion. The fixed portion is configured to be fixable to a fixing member included in the application mechanism. The container portion is provided with, in upper and lower portions thereof, holes through which the application needle passes. A side surface of the container portion has a first flange. A lower surface of the first flange is in contact with an upper surface of the fixed portion. A gap is provided between a portion lower than the first flange on the side surface of the container portion and a side surface of the fixed portion. The container portion is horizontally movable within a range of the gap.

Preferably, the side surface of the container portion has a second flange below the first flange. An upper surface of the second flange is in contact with a lower surface of the fixed portion, and the fixed portion is thereby sandwiched between the first flange and the second flange.

An application apparatus in the present invention has the above-described application mechanism mounted thereon.

A method for manufacturing an object to which an application material is applied in the present invention uses any one of the above-described application mechanism and the above-described application apparatus.

A method for manufacturing a substrate in the present invention includes drawing a circuit pattern of a substrate by applying an application material onto a substrate surface to which the application material is applied, using the above-described application apparatus.

Advantageous Effects of Invention

According to the present invention, it is possible to prevent an application needle axis from being shifted with respect to an attachment hole when an application material container is attached.

BRIEF DESCRIPTION OF DRAWINGS

FIGS. 3(A) and (B) are development views of a flange portion including a cam surface when viewed from the side.

DESCRIPTION OF EMBODIMENTS

Embodiments of the present invention will be described hereinafter with reference to the drawings.

First Embodiment

Embodiments of the present invention will be described hereinafter with reference to the drawings. In the following description, the same components are denoted by the same reference characters. Their names and functions are also the same. Therefore, detailed description thereof will not be repeated.

[Overall Configuration of Application Apparatus]

Figure 1:
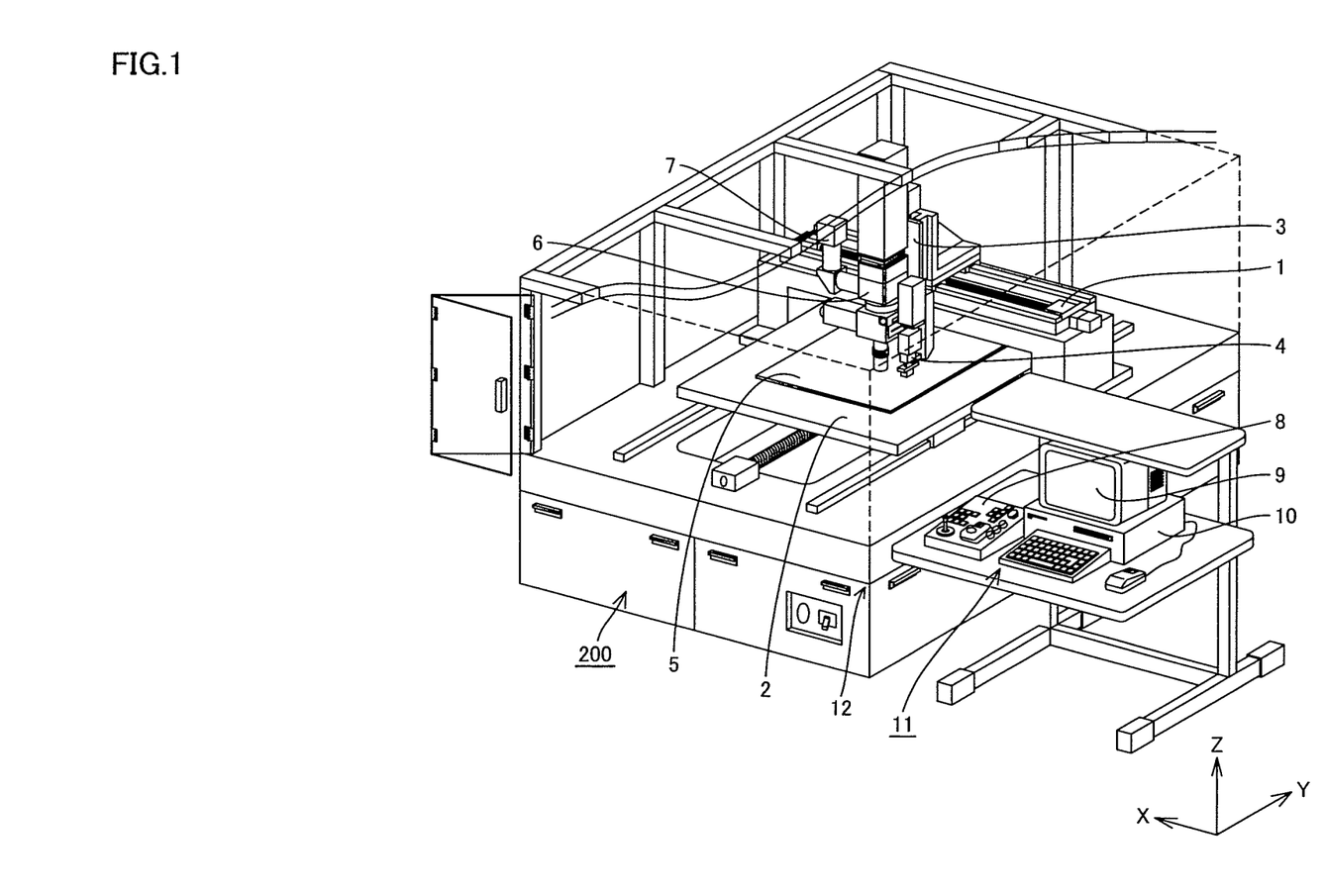
FIG. 1 is a schematic perspective view of an application apparatus.

FIG. 1 is a schematic perspective view of an application apparatus 200 according to an embodiment of the present invention. Referring to FIG. 1, application apparatus 200 in a first embodiment of the present invention includes a base 12 arranged on a floor surface, an X-axis table 1, a Y-axis table 2, a Z-axis table 3, an application mechanism 4, an observation optical system 6, a CCD camera 7 connected to observation optical system 6, and a controller 11.

Y-axis table 2 configured to be movable in a Y-axis direction in FIG. 1 is placed on an upper surface of base 12. Specifically, a guide portion is placed on a lower surface of Y-axis table 2 and is connected so as to be slidable along a guide rail placed on the upper surface of base 12. A ball screw is also connected to the lower surface of Y-axis table 2. By operating the ball screw with a driving member such as a motor, Y-axis table 2 can move along the guide rail (in the Y-axis direction). An upper surface portion of Y-axis table 2 is a mounting surface for mounting a substrate 5 which is an object to which an application material is applied.

A gate-type construction placed so as to extend across the guide rail of Y-axis table 2 in an X-axis direction is provided on base 12. X-axis table 1 movable in the X-axis direction is mounted on this construction. X-axis table 1 is movable in the X-axis direction using, for example, a ball screw.

Z-axis table 3 is mounted on a moving body of X-axis table 1, and application mechanism 4 and observation optical system 6 are mounted on Z-axis table 3. Application mechanism 4 and observation optical system 6 are movable in the X-axis direction together with Z-axis table 3. Application mechanism 4 is provided to apply an application material onto a surface (upper surface side) of substrate 5 to which the application material is applied, using an application needle provided in application mechanism 4. Observation optical system 6 is provided to observe an application position of substrate 5 to which the application material is applied. CCD camera 7 of observation optical system 6 converts an observed image to an electric signal. Z-axis table 3 supports application mechanism 4 and observation optical system 6 so as to be movable in a Z-axis direction.

Controller 11 includes an operation panel 8, a monitor 9 and a control computer 10. Controller 11 controls X-axis table 1, Y-axis table 2, Z-axis table 3, application mechanism 4, and observation optical system 6. Operation panel 8 is used to input a command to control computer 10. Monitor 9 displays image data converted by CCD camera 7 of observation optical system 6 and output data from control computer 10.

When a circuit pattern is formed on substrate 5 from the beginning or when a defect portion of a circuit pattern formed on substrate 5 is corrected, a drawing position of substrate 5 to which the application material is applied is moved to a position directly below observation optical system 6 using X-axis table 1 and Y-axis table 2, and a drawing start position is observed and checked using observation optical system 6, to determine the drawing start position. Then, the circuit pattern is drawn based on the determined drawing start position. Using X-axis table 1 and Y-axis table 2, substrate 5 is moved from the drawing start position, such that the drawing position is located directly below application mechanism 4. When the movement is completed, application mechanism 4 is driven to apply the liquid material. By continuously repeating this, the circuit pattern can be drawn.

A relation between a moving-down end position of an application needle 24 and a focus position of observation optical system 6 is prestored, and at the time of drawing, using the Z-axis table, a position of an image focused by observation optical system 6 is moved to a height at which application needle 24 is in contact with substrate 5 with respect to the Z-axis direction, and then, the application material is applied. When an area of a drawn circuit pattern is large and a substrate surface height of substrate 5 to which the application material is applied changes significantly in the process of drawing, the focus position is checked in the process of drawing as needed and the position in the Z-axis direction is corrected, and then, the application material is applied. Adjustment of the focus position at this time may be made using a method for automatic focusing with image processing, or a method for using a laser sensor and the like to constantly detect the height position of the surface of substrate 5 to which the application material is applied and make a correction in real time.

According to a method for manufacturing the substrate including the step of using the above-described method for drawing the circuit pattern on substrate 5 to form the circuit pattern of the substrate from the beginning, the substrate having the pattern formed thereon can be obtained. In addition, according to a method for manufacturing the substrate including the step of using the above-described method for drawing the circuit pattern on substrate 5 to correct a defect of the circuit pattern of the substrate already formed by the other method such as a printing method or an ink-jet method, the substrate having no defect of the pattern can be obtained.

(Configuration of Application Mechanism)

Application mechanism 4 mentioned above will be described in more detail with reference to FIGS. 2 and 4. Application mechanism 4 fixed to Z-axis table 3 shown in FIG. 1 mainly includes a servo motor 41, a cam 43, a bearing 44, a cam coupling plate 45, a movable portion 46, an application needle holder 20, application needle 24 held in application needle holder 20, and an application material container 21. Servo motor 41 is placed such that a rotation shaft thereof extends in a direction along the Z-axis direction shown in FIG. 1. Cam 43 is connected to the rotation shaft of servo motor 41. Cam 43 is rotatable about the rotation shaft of servo motor 41.

Cam 43 includes a central portion connected to the rotation shaft of servo motor 41, and a flange portion connected to one end of the central portion. As shown in FIG. 3(A), an upper surface (surface on the servo motor 41 side) of the flange portion is a cam surface 61. Cam surface 61 is formed to have an annular shape along an outer circumference of the central portion, and is formed to have a slope shape such that a distance from a bottom surface of the flange portion varies. Specifically, as shown in FIG. 3(B), cam surface 61 includes an upper end flat region 62 having the longest distance from the bottom surface of the flange portion, a lower end flat region 63 spaced apart from upper end flat region 62 and having the shortest distance from the bottom surface of the flange portion, and a slope portion connecting upper end flat region 62 and lower end flat region 63. FIG. 3(B) is a development view of the flange portion including cam surface 61 arranged annularly so as to surround the central portion, when viewed from the side.

Bearing 44 is arranged so as to be in contact with cam surface 61 of cam 43. As shown in FIG. 2(A), bearing 44 is arranged in a specific direction (on the right side of servo motor 41) when viewed from cam 43, and when the rotation shaft of servo motor 41 rotates and cam 43 thereby rotates, the state of contact between bearing 44 and cam surface 61 is maintained. Cam coupling plate 45 is connected to bearing 44. The other end opposite to one end of cam coupling plate 45 connected to bearing 44 is fixed to movable portion 46. An application needle holder fixing portion 47 and an application needle holder housing portion 48 are connected to movable portion 46. Application needle holder 20 is housed in application needle holder housing portion 48.

Application needle holder 20 includes application needle 24. Application needle 24 is arranged so as to protrude from application needle holder 20 on a lower surface (lower side opposite to the side where servo motor 41 is located) of application needle holder 20. Application material container 21 is arranged below application needle holder 20. Application needle 24 is held in application material container 21 in an inserted state.

A fixing pin 52 is placed in movable portion 46. In addition, other fixing pin 51 is placed in a stand that holds servo motor 41. A spring 50 is placed so as to connect fixing pins 51 and 52. Spring 50 allows movable portion 46 to be under tensile force toward the application material container 21 side. This tensile force caused by spring 50 acts on bearing 44 through movable portion 46 and cam coupling plate 45. This tensile force caused by spring 50 allows bearing 44 to maintain a state of being pressed against cam surface 61 of cam 43.

In addition, movable portion 46, application needle holder fixing portion 47 and application needle holder housing portion 48 are connected to a linear guide 49 placed on the above-described stand. Linear guide 49 is arranged so as to extend in the Z-axis direction. Therefore, movable portion 46, application needle holder fixing portion 47 and application needle holder housing portion 48 are movable along the Z-axis direction.

Application material container 21 is fixed to a member 69.

[Conventional Application Material Container]

Figure 4:
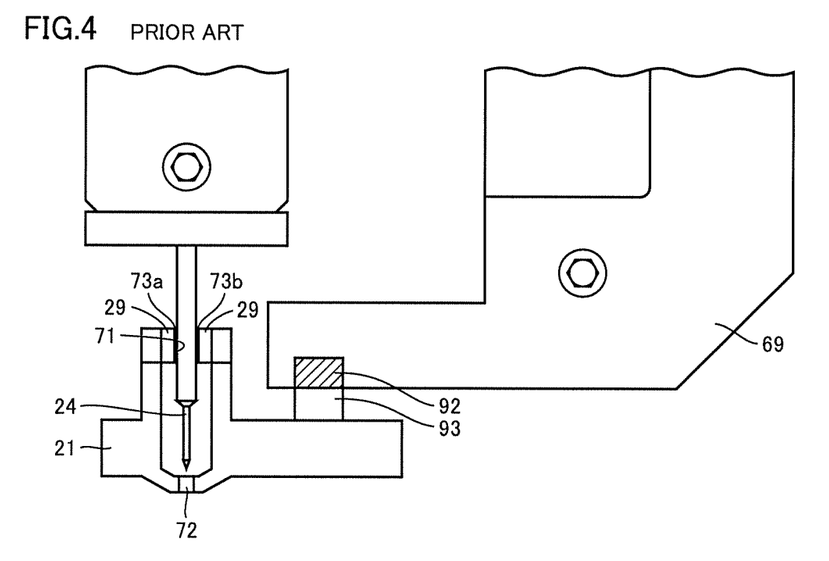
FIG. 4 is a cross-sectional view of a conventional application material container attached to a member when viewed from the side.

FIG. 4 is a cross-sectional view of conventional application material container 21 attached to member 69 when viewed from the side.

An application material used when a pattern is drawn is housed in application material container 21. This application material is a high-viscosity metal conductive material and the like. A lower hole 72 is open in a bottom portion of application material container 21, and an upper hole 71 is open in an upper lid portion 29.

Application needle 24 is provided so as to be movable along a straight line passing through lower hole 72 and upper hole 71. A linear motion mechanism of application mechanism 4 allows application needle 24 to reciprocate in the upward and downward direction.

Lower hole 72 is set to have a size that allows application needle 24 to penetrate therethrough and a tip of application needle 24 to protrude downward, and a size that prevents the application material held in application material container 21 from dripping. Upper hole 71 has a size that allows application needle 24 to reciprocate in the upward and downward direction. That is, application needle 24 can move in the upward and downward direction, and thus, minute gaps 73a and 73b are formed between a wall of upper hole 71 and application needle 24. When application needle 24 that can reciprocate in the upward and downward direction moves downward, application needle 24 protrudes from lower hole 72 toward the object to which the application material is applied, with the application material adhering to a surface of the tip of application needle 24.

A fixing pin 93 of application material container 21 is bonded to a magnet 92 of member 69, and application material container 21 is thereby fixed. When a bonding position is displaced or when application material container 21 varies in size, application needle 24 is not placed at a correct position in some cases.

Figure 5:
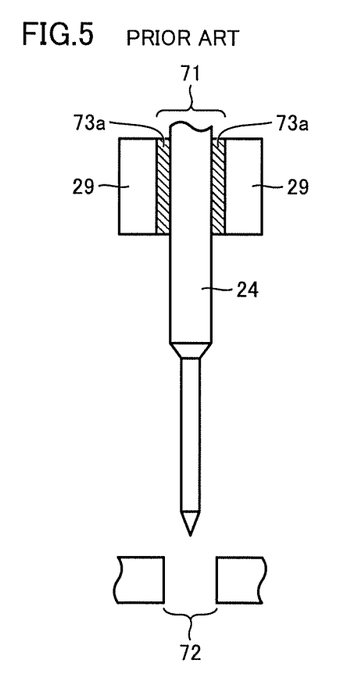
FIG. 5 shows an example in which an application needle is placed at a correct position in the case of using the conventional application material container.

FIG. 5 shows an example in which application needle 24 is placed at a correct position in the case of using conventional application material container 21. In the example shown in FIG. 5, by moving application needle 24 in the downward direction, the tip of application needle 24 can protrude from lower hole 72.

Figure 6:
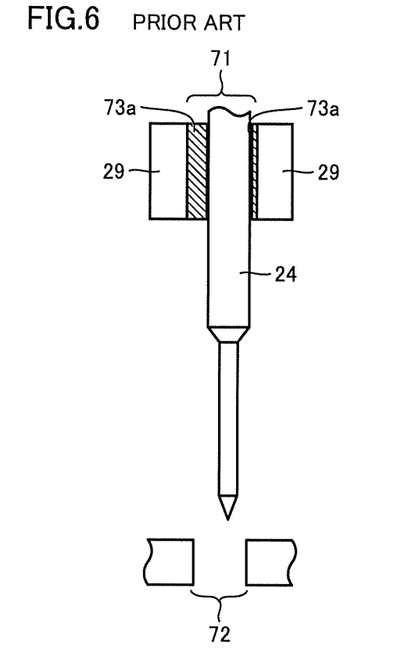
FIG. 6 shows an example in which the application needle is placed at a displaced position in the case of using the conventional application material container.

FIG. 6 shows an example in which application needle 24 is placed at a displaced position in the case of using conventional application material container 21. In the example shown in FIG. 6, the position of application needle 24 is displaced, and thus, the tip of application needle 24 protrudes from lower hole 72 in a shifted state. This shift causes a change in an amount of application.

Figure 7:
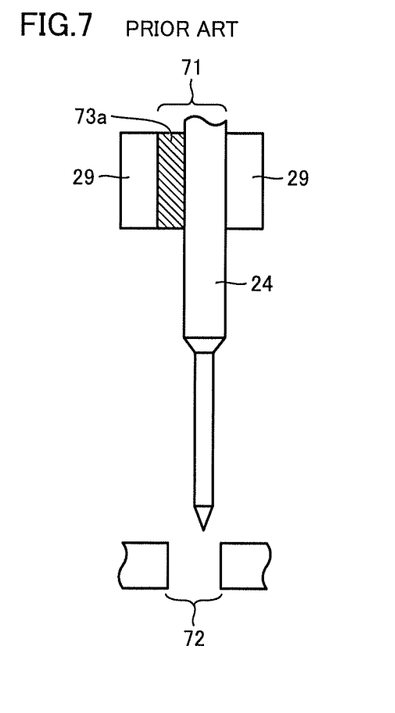
FIG. 7 shows another example in which the application needle is placed at a displaced position in the case of using the conventional application material container.

FIG. 7 shows another example in which application needle 24 is placed at a displaced position in the case of using conventional application material container 21. In the example shown in FIG. 7, application needle 24 is displaced to the right side, and thus, left gap 73a between the wall of upper hole 71 and application needle 24 becomes larger and no gap is provided between the wall of upper hole 71 and the right side. As a result, the force acts on a contact portion between the wall of upper hole 71 and application needle 24, and thus, an unbalanced load occurs.

[Application Material Container in First Embodiment]

Figure 8:
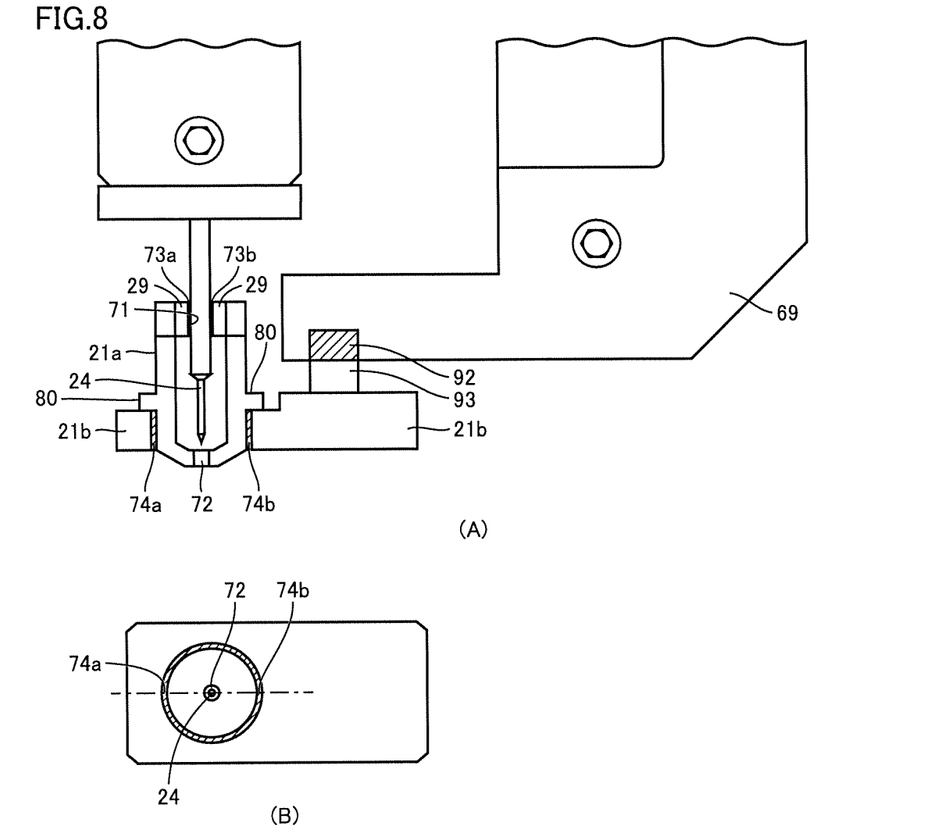
FIG. 8(A) is a cross-sectional view of an application material container in a first embodiment attached to a member when viewed from the side.
FIG. 8(B) shows the application material container when viewed from the bottom.

FIG. 8(A) is a cross-sectional view of application material container 21 in a first embodiment attached to member 69 when viewed from the side. FIG. 8(B) shows application material container 21 when viewed from the bottom.

Application material container 21 in the first embodiment shown in FIGS. 8(A) and (B) is different from conventional application material container 21 shown in FIG. 4 in that application material container 21 in the first embodiment is divided into a fixed portion 21b and a container portion 21a.

Fixed portion 21b has fixing pin 93. Fixing pin 93 is bonded to magnet 92 of member 69, and fixed portion 21b is thereby fixed.

A flange 80 is provided on a side surface of container portion 21a. An upper surface of fixed portion 21b is in contact with a lower surface of flange 80 to thereby support flange 80. Gaps 74a and 74b are provided between a portion lower than flange 80 on the side surface of container portion 21a and a side surface of fixed portion 21b.

Container portion 21a can be inserted into fixed portion 21b so as to have gaps 74a and 74b therebetween. Even after fixing pin 93 of fixed portion 21b is bonded to magnet 92 of member 69, container portion 21a can move in the right and left direction within the range of gaps 74a and 74b. Therefore, even if gaps 73a and 73b between upper hole 71 of container portion 21a and application needle 24 are reduced in size, container portion 21a can be easily placed at a correct position with respect to application needle 24.

Figure 9:
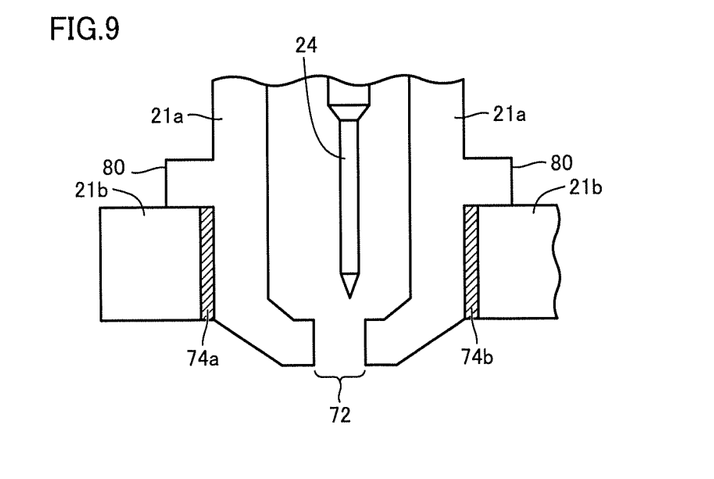
FIG. 9 shows an example in which an application needle is placed at a displaced position in the case of using the application material container in the first embodiment.

FIG. 9 shows an example in which application needle 24 is placed at a displaced position in the case of using application material container 21 in the first embodiment.

As shown in FIG. 9, application needle 24 is placed at a position displaced to the left side, and thus, the tip of application needle 24 protrudes from a position shifted from lower hole 72.

Figure 10:
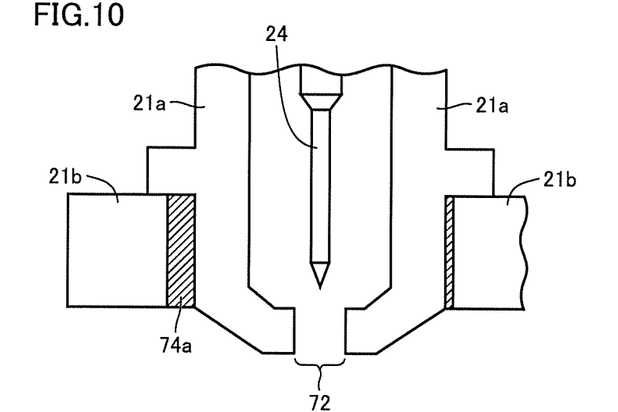
FIG. 10 shows a state in which a container portion has been moved from the state shown in FIG. 9 to the right side.

FIG. 10 shows a state in which container portion 21a has been moved from the state shown in FIG. 9 to the right side.

By moving container portion 21a to the right side, left gap 74a becomes larger and right gap 74b becomes smaller. By moving container portion 21a to the right side along application needle 24, alignment is performed, and application needle 24 can protrude from a more central position of lower hole 72 without occurrence of an unbalanced load between application needle 24 and upper hole 71. As a result, the application material can be applied at a more stable amount of application.

[Operation of Application Mechanism]

Next, the operation of application mechanism 4 described above will be described. In application mechanism 4 described above, servo motor 41 is driven to thereby rotate the rotation shaft of servo motor 41 and rotate cam 43. As a result, the height of cam surface 61 of cam 43 in the Z-axis direction changes, and thus, the position of bearing 44 in the Z-axis direction that is in contact with cam surface 61 on the right side of cam 43 in FIG. 2(A) also varies in accordance with the rotation of a drive shaft of servo motor 41. In accordance with this variation of the position of bearing 44 in the Z-axis direction, movable portion 46, application needle holder fixing portion 47 and application needle holder housing portion 48 move in the Z-axis direction. As a result, application needle holder 20 held in application needle holder housing portion 48 also moves in the Z-axis direction, and thus, the position of application needle 24 in the Z-axis direction placed in application needle holder 20 can be changed.

Figure 2:
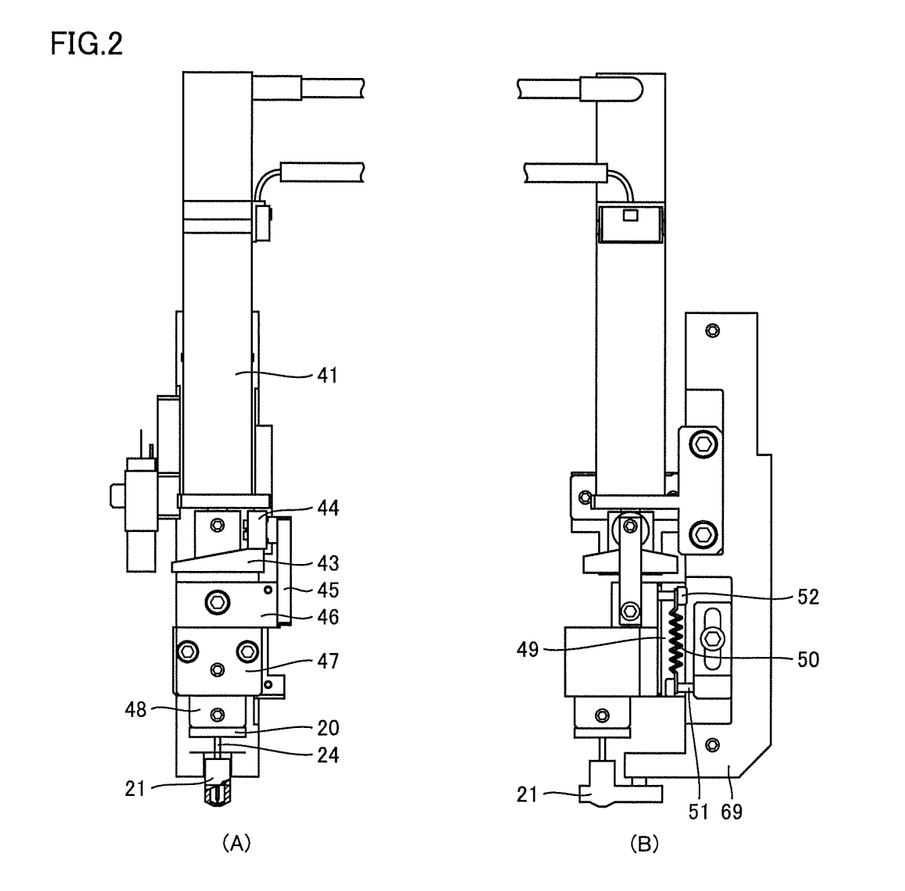
FIG. 2(A) is a front view of an application mechanism.
FIG. 2(B) is a side view of the application mechanism.
Figure 3:
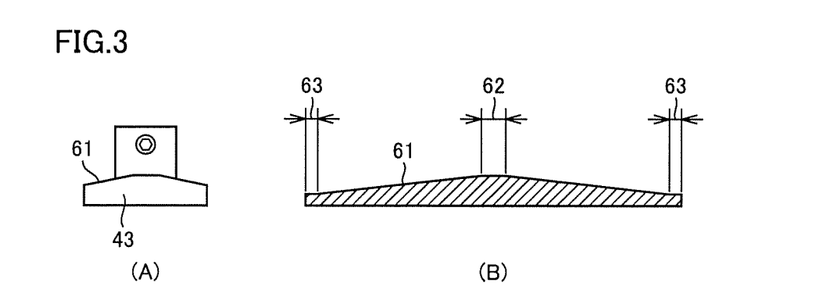

Specifically, referring to FIGS. 2 and 3, when bearing 44 is in contact with upper end flat region 62 on cam surface 61 of cam 43, application needle 24 is arranged at an upper end position thereof (position closest to servo motor 41). At this time, the tip portion of application needle 24 is being immersed in the application material held in application material container 21.

Next, the rotation shaft of servo motor 41 is rotated and cam 43 thereby rotates, and when lower end flat region 63 of cam surface 61 reaches the position of being in contact with bearing 44, application needle 24 passes through lower hole 72 formed in the bottom portion of application material container 21 and protrudes downward from the bottom surface of application material container 21. At this time, a part of the application material adheres to the surface of application needle 24 protruding from the bottom surface of application material container 21. Z-axis table 3 (see FIG. 1) moves application mechanism 4 to the substrate 5 side, and thus, the tip portion of application needle 24 can come into contact with the surface of substrate 5 and the application material can be applied onto the surface of substrate 5. In the present embodiment, as described above, the position of container portion 21a is moved horizontally and the tip of application needle 24 is thereby adjusted so as to be located at the center of lower hole 72, and thus, the application material can be appropriately applied onto the surface of substrate 5. Movement by Z-axis table 3 may be first performed and then servo motor 41 may be driven, or the operation of Z-axis table 3 and the operation of servo motor 41 may be performed almost at the same time.

In this way, in application mechanism 4 described above, the rotation motion of servo motor 41 can be converted to the motion (upward and downward motion) of application needle 24 in the Z-axis direction. With such a configuration, application needle 24 can be moved in the Z-axis direction rapidly and accurately.

Second Embodiment

Figure 11:
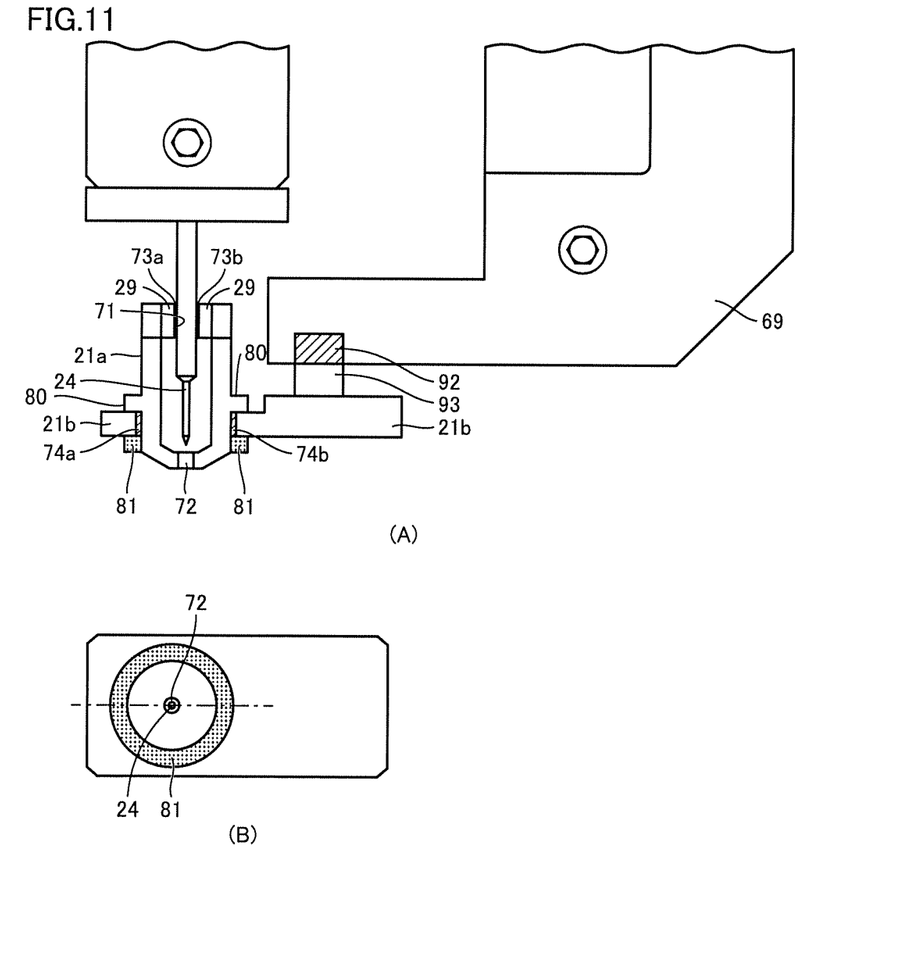
FIG. 11(A) is a cross-sectional view of an application material container in a second embodiment attached to a member when viewed from the side.
FIG. 11(B) shows the application material container when viewed from the bottom.

FIG. 11(A) is a cross-sectional view of application material container 21 in a second embodiment attached to member 69 when viewed from the side. FIG. 11(B) shows application material container 21 when viewed from the bottom.

In addition to flange 80, a flange 81 is provided on the side surface of container portion 21a. The upper surface of fixed portion 21b is in contact with the lower surface of flange 80 to thereby support flange 80. Gaps 74a and 74b are provided between the portion lower than flange 80 on the side surface of container portion 21a and the side surface of fixed portion 21b.

An upper surface of flange 81 on the side surface of container portion 21a is in contact with a lower surface of fixed portion 21b.

Fixed portion 21b is sandwiched between flange 80 and flange 81, which makes it possible to prevent disconnection of container portion 21a from fixed portion 21b.

In the present embodiment, the problem of occurrence of an unbalanced load caused by the force acting on the contact portion between the wall of upper hole 71 and application needle 24 can be avoided and the application material can be applied at a more stable amount of application, similarly to the first embodiment. Furthermore, in the present embodiment, container portion 21a is never disconnected from fixed portion 21b, and application material container 21 is easily attached and detached.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The present invention is particularly advantageously applied to an application mechanism and an application apparatus for drawing a conductive pattern, correcting an open defect of a conductive pattern, forming and correcting a defect of a fine circuit pattern such as an RFID tag, applying a conductive adhesive, and the like.

REFERENCE SIGNS LIST

1 X-axis table; 2 Y-axis table; 3 Z-axis table; 4 application mechanism; 5 substrate; 6 observation optical system; 7 camera; 8 operation panel; 9 monitor; 10 control computer; 11 controller; 12 base; 20 application needle holder; 21 application material container; 24 application needle; 29 upper lid portion; 41 servo motor; 43 cam; 44 bearing; 45 cam coupling plate; 46 movable portion; 47 application needle holder fixing portion; 48 application needle holder housing portion; 49 linear guide; 50 spring; 51, 52, 93 fixing pin; 61 cam surface; 62 upper end flat region; 63 lower end flat region; 69 fixing member; 71 upper hole; 72 lower hole; 73a, 73b, 74a, 74b gap; 80, 81 flange; 92 magnet; 200 application apparatus.

The invention claimed is:

1. An application mechanism comprising:
   an application needle; and
   an application material container configured to house and hold an application material,
   the application material container having a fixed portion and a container portion,
   the fixed portion being configured to be fixable to a fixing member included in the application mechanism,
   the container portion being provided with, in upper and lower portions thereof, holes through which the application needle passes,
   a side surface of the container portion having a first flange,
   a lower surface of the first flange being in contact with an upper surface of the fixed portion,
   a gap being provided between a portion lower than the first flange on the side surface of the container portion and a side surface of the fixed portion, and the container portion being horizontally movable within a range of the gap.

2. The application mechanism according to claim 1, wherein
   the side surface of the container portion has a second flange below the first flange, and
   an upper surface of the second flange is in contact with a lower surface of the fixed portion, and the fixed portion is thereby sandwiched between the first flange and the second flange.

3. An application apparatus having the application mechanism as recited in claim 1 mounted thereon.

4. A method of manufacturing a substrate, comprising drawing a circuit pattern on a substrate by applying an application material onto a substrate surface to which the application material is applied using the application mechanism as recited in claim 1.

5. A method for manufacturing a substrate, comprising drawing a circuit pattern of a substrate by applying an application material onto a substrate surface to which the application material is applied, using the application apparatus as recited in claim 3.

6. An application apparatus having the application mechanism as recited in claim 2 mounted thereon.

7. A method of manufacturing a substrate, comprising drawing a circuit pattern on a substrate by applying an application material onto a substrate surface to which the application material is applied using the application mechanism as recited in claim 2.

* * * * *